United States Patent
Strauss (10) Patent No.: US 8,431,937 B2
(45) Date of Patent: Apr. 30, 2013

(54) SEMICONDUCTOR CHIP AND METHOD FOR PRODUCING A SEMICONDUCTOR CHIP

(75) Inventor: Uwe Strauss, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 791 days.

(21) Appl. No.: 12/442,501

(22) PCT Filed: Sep. 10, 2007

(86) PCT No.: PCT/DE2007/001638
§ 371 (c)(1),
(2), (4) Date: Apr. 17, 2009

(87) PCT Pub. No.: WO2008/040289
PCT Pub. Date: Apr. 10, 2008

(65) Prior Publication Data
US 2010/0038664 A1    Feb. 18, 2010

(30) Foreign Application Priority Data

Sep. 29, 2006 (DE) .......................... 10 2006 046 677
Jan. 29, 2007 (DE) .......................... 10 2007 004 302

(51) Int. Cl.
*H01L 27/15* (2006.01)

(52) U.S. Cl.
USPC ................................... 257/79; 257/E33.068

(58) Field of Classification Search .................... 257/79, 257/96, 777, E33.068, E33.069, E33.074
See application file for complete search history.

(56) References Cited

U.S. PATENT DOCUMENTS

| 3,739,217 A | 6/1973 | Bergh et al. |
| 6,495,862 B1 | 12/2002 | Okazaki et al. |
| 6,563,142 B2 | 5/2003 | Shen et al. |
| 6,657,236 B1 | 12/2003 | Thibeault et al. |
| 6,697,405 B2 | 2/2004 | Kitatani et al. |
| 6,756,731 B1 | 6/2004 | Sano |
| 6,929,966 B2 | 8/2005 | Illek et al. |
| 7,109,527 B2 | 9/2006 | Illek et al. |

(Continued)

FOREIGN PATENT DOCUMENTS

| CN | 1674307 A | 9/2005 |
| DE | 100 27 199 A1 | 1/2001 |

(Continued)

OTHER PUBLICATIONS

Wu et al., "Effect of the Silver Mirror Location on the Luminance Intensity of Double-Roughened GaN Light-Emitting Diodes," Electrochemical and Solid-State Letters, vol. 10, Issue 10, pp. J126-J128, Jul. 24, 2007.*

(Continued)

*Primary Examiner* — Matthew Landau
*Assistant Examiner* — Candice Chan
(74) *Attorney, Agent, or Firm* — Slater & Matsil, L.L.P.

(57) ABSTRACT

A semiconductor chip includes a carrier and a semiconductor body, which includes a semiconductor layer sequence having an active region provided for generating radiation. The carrier has a first carrier area facing the semiconductor body and a second carrier area remote from the semiconductor body. The semiconductor body is cohesively fixed to the carrier by means of a connection layer. A plurality of reflective or scattering elements are formed between the second carrier area and the active region.

34 Claims, 5 Drawing Sheets

U.S. PATENT DOCUMENTS

| | | | |
|---|---|---|---|
| 7,129,528 B2 * | 10/2006 | Bader et al. | 257/98 |
| 7,375,380 B2 | 5/2008 | Asahara et al. | |
| 7,442,966 B2 | 10/2008 | Bader et al. | |
| 7,692,204 B2 | 4/2010 | Stein et al. | |
| 7,860,144 B2 | 12/2010 | Kühnelt et al. | |
| 2004/0119084 A1 | 6/2004 | Hsieh et al. | |
| 2005/0093008 A1 | 5/2005 | Suehiro et al. | |
| 2005/0104080 A1 | 5/2005 | Ichihara et al. | |
| 2005/0184297 A1 * | 8/2005 | Hsieh | 257/79 |
| 2006/0001035 A1 | 1/2006 | Suehiro et al. | |
| 2006/0006402 A1 | 1/2006 | Hsieh et al. | |
| 2006/0054898 A1 | 3/2006 | Lai et al. | |
| 2006/0163595 A1 | 7/2006 | Hsieh et al. | |
| 2006/0273335 A1 | 12/2006 | Asahara et al. | |

FOREIGN PATENT DOCUMENTS

| | | |
|---|---|---|
| DE | 102 45 628 A1 | 4/2004 |
| EP | 1 276 158 A2 | 1/2003 |
| GB | 2 373 368 A | 9/2002 |
| JP | 2000-114174 A | 4/2000 |
| JP | 2000-260997 A | 9/2000 |
| JP | 2002-185079 A | 6/2002 |
| TW | 516246 B | 1/2003 |
| TW | I224875 B | 12/2004 |
| WO | WO 2006/006555 A1 | 1/2006 |

OTHER PUBLICATIONS

Huo, D., et al., "Mirror adhesion technique boosts LED chip brightness," compoundsemiconductor.net, Dec. 2003, 3 pages.

Schnitzer, I., et al., "30% external quantum efficiency from surface textured, thin-film light-emitting diodes," Appl. Phys. Lett., Oct. 18, 1993, 3 pages, vol. 63, No. 16, American Institute of Physics.

* cited by examiner

SEMICONDUCTOR CHIP AND METHOD FOR PRODUCING A SEMICONDUCTOR CHIP

This patent application claims priority to German patent applications 10 2006 046 677.2 filed Sep. 29, 2006 and 10 2007 004 302.5 filed Jan. 29, 2007, the disclosure content of which are hereby incorporated by reference.

TECHNICAL FIELD

The invention relates to a semiconductor chip and to a method for producing a semiconductor chip.

BACKGROUND

The production of LED semiconductor chips having a high coupling-out efficiency, that is to say a large ratio of the number of photons coupled out from the semiconductor chip to the number of photons generated in the semiconductor chip, generally requires costly production processes. An increase in the coupling-out efficiency for LEDs is therefore usually accompanied by an increase in the production costs.

SUMMARY

It is an object of the present invention to specify a semiconductor chip, in particular a semiconductor chip for an LED, which can be produced cost-effectively with high coupling-out efficiency. Furthermore, the intention is to specify a method by which a semiconductor chip can be produced cost-effectively.

A semiconductor chip according to the invention, which is preferably embodied as an LED semiconductor chip, has a carrier and a semiconductor body. The semiconductor body comprises a semiconductor layer sequence comprising an active region provided for generating radiation. The carrier has a first carrier area facing the semiconductor body and a second carrier area remote from the semiconductor body. Furthermore, the semiconductor body is cohesively fixed to the carrier by means of a connection layer, and a plurality of reflective or scattering elements are formed between the second carrier area and the active region.

The cohesive connection—formed by means of the connection layer—for fixing the semiconductor body to the carrier can advantageously be produced cost-effectively and in a simplified manner, for instance in comparison with fixing by means of eutectic bonding.

A cohesive connection is produced between the semiconductor body and the carrier by means of the connection layer. In this case, a cohesive connection is understood to mean, in particular, a connection in which the connection partners are joined together and held together on account of atomic or molecular forces. Typical examples of cohesive connections are connections produced by means of adhesive bonding, soldering, welding or electroplating. In the context of the invention, a connection layer is understood to mean a layer formed by means of a separate connection means involved in the production of the cohesive connection.

By contrast, an epitaxially deposited layer, for instance a buffer layer, arranged between a growth substrate and a semiconductor body, is not regarded as a connection layer within the meaning of the present invention.

In a preferred configuration, the plurality of reflective or scattering elements are formed between the second carrier area and the semiconductor body. Consequently, the plurality of reflective or scattering elements can be formed outside the semiconductor body.

In a further preferred configuration, a contact layer transmissive to radiation generated in the active region is formed between the semiconductor body and the connection layer. Particularly preferably, the contact layer contains a transparent conductive oxide (TCO). Transparent conductive oxides are transparent, conductive materials, generally metal oxides, such as, for example, zinc oxide, tin oxide, cadmium oxide, titanium oxide, indium oxide or indium tin oxide (ITO). Alongside binary metal-oxygen compounds such as, for example, $ZnO$, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can also be p-doped or n-doped.

A contact layer of this type has the advantage that it can be embodied such that it is transmissive to radiation generated in the semiconductor body, with high transverse conductivity.

A TCO-containing contact layer can be deposited, for example by sputtering or vapor deposition, on an, in particular prefabricated, semiconductor body.

In a further preferred configuration, the connection layer is embodied such that it is transmissive to radiation generated in the active region of the semiconductor body. Absorption losses during the passage of this radiation through the connection layer can advantageously be reduced in this way.

Furthermore, the connection layer and/or the contact layer are preferably matched to the refractive index of the semiconductor body with regard to their/its refractive indices/index. In case of doubt here the refractive index of the semiconductor body is understood to mean the averaged refractive index of the semiconductor layer sequence. The smaller the difference between the refractive index of the connection layer and/or of the contact layer and that of the semiconductor body, the greater the proportion of the radiation emitted in the direction of the carrier which can emerge from the semiconductor body and impinge on the plurality of reflective or scattering elements.

In a further preferred configuration, the connection layer is formed by means of a connection means. The connection means is preferably embodied as a molding compound. By way of example, the connection layer can be an adhesive layer formed by means of an adhesive agent. A simple and cost-effective production of a cohesive connection is thereby facilitated.

In a preferred development, the connection layer, for example the adhesive layer, is embodied in electrically insulating fashion. The semiconductor body can thus be fixed to the carrier in a manner electrically insulated therefrom.

The semiconductor chip preferably has two contacts that are electrically conductively connected to the semiconductor body. Via these contacts, a current can be impressed into the semiconductor body for the operation of the semiconductor chip by application of an external electrical voltage. In this case, the contacts are expediently arranged such that the current flows through the active region. Both contacts can be arranged on that side of the connection layer which is remote from the carrier. In this case, the elements arranged between the contact layer and the second carrier area, in particular the carrier and the connection layer, can be embodied in electrically insulating fashion. In an alternative variant, one of the contacts is arranged on the second carrier area. In this variant, the connection layer and the carrier are preferably embodied in electrically conductive fashion.

In a further preferred configuration, the connection layer is embodied in such a way that wave guiding of the radiation generated in the active region is disturbed within the connection layer.

The wave guiding in the connection layer can be caused for example by radiation that runs in the connection layer being reflected back and forth between two areas that run parallel to one another in a lateral direction, that is to say in a direction along a main extension direction of the semiconductor layers of the semiconductor layer sequence, and bound to the connection layer. In this case, the angle at which the radiation impinges on the areas, during the successive reflections, has a constant value lying above the angle of total reflection. Consequently, this radiation circulating in the connection layer cannot emerge through said areas and is ultimately absorbed in the connection layer. By disturbing the wave guiding, it is possible to increase the proportion of the radiation which emerges from the connection layer and in particular subsequently passes through the radiation exit area. The coupling-out efficiency from the semiconductor chip is advantageously increased as a result of this.

In a preferred development, the plurality of reflective or scattering elements are formed by means of particles formed in the connection layer. The particles can be embedded into a matrix material for the connection layer. The particles preferably have a refractive index that is different from the refractive index of the matrix material. In this case, the particles can be embodied such that they are transmissive or reflective to radiation generated in the active region. The particles can be embodied for example as metal particles, for instance as silver particles.

The direction in which radiation propagates in the connection layer can be altered on account of scattering or reflection at said particles. As a result, by way of example, after total reflection at one of the areas bounding the connection layer, radiation can be scattered at the particles in such a way that it subsequently impinges on one of said areas at an angle that is less than the critical angle of total reflection. The particles can thus disturb the wave guiding in the connection layer. The coupling-out efficiency from the semiconductor chip can advantageously be increased in this way.

In a preferred configuration, a mirror layer is arranged between the semiconductor body and the carrier. Therefore, the mirror layer is not part of the semiconductor body. The mirror layer is provided for reflecting radiation that is generated in the active region and emitted in the direction of the carrier. Furthermore, the mirror layer prevents absorption of the radiation in the carrier or in a layer arranged between the mirror layer and the carrier. Consequently, the carrier can advantageously be chosen independently of the absorption properties for radiation generated in the active region.

The mirror layer is preferably applied by means of deposition, for example vapor deposition or sputtering, on the semiconductor body or on the carrier. Furthermore, the mirror layer preferably contains a metal and is particularly preferably embodied in a metallic fashion.

The semiconductor chip expediently has a radiation exit area on a side of the active region that is remote from the carrier. What can be achieved by means of the mirror layer in a simplified manner is that the radiation generated in the active region predominantly emerges through said radiation exit area.

In a preferred configuration, the plurality of reflective or scattering elements are formed by means of an interface having a surface structure at least in regions. In this case, the reflective or scattering elements are partial regions of the interface that are formed by the surface structure of the interface.

Preferably, at least two partial regions of the interface with the surface structure run obliquely or perpendicular with respect to one another at least in regions. By means of the interface with the surface structure it is possible to disturb the wave guiding, in particular in a layer adjacent to said interface. The coupling-out efficiency of the radiation from the semiconductor chip can advantageously be increased in this way.

The connection layer can be integrally formed onto the interface with the surface structure. The wave guiding of radiation generated in the active region within the connection layer can advantageously be disturbed in this way.

In a preferred configuration, the surface structure of the interface is formed by means of a structured surface. In this case, a structured surface is understood to mean a surface of a body, for example of a semiconductor layer of the semiconductor layer sequence, of the carrier, or of the contact layer, which has structure elements produced by means of partial removal of the body on the part of the surface. The structure elements are preferably produced mechanically and/or chemically, for example by means of mechanical roughening, wet-chemical etching, or dry-chemical etching, for instance by means of chemically assisted ion beam etching (CAIBE) or reactive ion etching (RIE).

In a first embodiment variant, the interface with the surface structure is the structured surface.

In a second embodiment variant, the interface with the surface structure is an area of a layer that faces the active region, wherein the surface structure of the interface follows the structure of a surface that is structured at least in regions. In this second embodiment variant, the structured surface can be arranged between the active region and the layer, preferably the mirror layer, wherein the layer is particularly preferably adjacent to the structured surface. In this case, the layer is integrally formed onto the structured surface, such that the surface structure of the interface imitates the structure of the structured surface.

As an alternative, in the second embodiment variant, the structured surface can be arranged between the interface with the surface structure and the carrier. In this case, a distance between the interface with the surface structure and the structured surface is preferably so small, in particular that is to say the layer thickness of the layer whose surface forms the interface with the surface structure is small enough, that the surface structure of the interface follows the structure of the structured surface. The layer thickness of said layer is at least small enough to avoid complete or substantially complete leveling of the structure of the structured surface.

In the second embodiment variant, the layer whose surface forms the interface with the surface structure is particularly preferably the mirror layer. The interface with the surface structure is therefore embodied in mirroring fashion.

In a configuration, the structured surface is arranged between the active region and the connection layer. Preferably, the structured surface is that area of the contact layer which faces the carrier. The wave guiding within the contact layer can be disturbed in this way. The coupling-out efficiency can advantageously be increased as a result.

In a further configuration, the structured surface is arranged between the connection layer and the second carrier area. Preferably, the structured surface is the first carrier area of the carrier.

It goes without saying that a structured surface can in each case also be arranged on both sides of the connection layer. By way of example, the first carrier area of the carrier and that area of the contact layer which faces the carrier can be embodied in each case as a structured surface.

The structure elements of the structured surface can be arranged irregularly. Irregularly arranged structure elements, for instance depressions, can be produced comparatively simply, for example by means of mechanical roughening.

As an alternative, the structure elements can be arranged regularly, in particular periodically. In this way, the structured surface can be shaped with a defined structure, for example for a photonic grating. By way of example, the photonic grating can be formed by means of a two-dimensional grating, that is to say by means of a grating having an alternating, periodically arranged, sequence of depressions and elevations in two directions running obliquely, preferably perpendicularly, with respect to one another.

Both regularly and irregularly arranged structure elements can be embodied for example in pyramid-like, truncated-pyramid-like, microprism-like or groove-like fashion. Furthermore, the structure elements can have curved surfaces at least in regions.

In a preferred development, the structure elements have a lateral extent lying between 0.1 times, inclusive, and 200 times, inclusive, particularly preferably between 0.5 times, inclusive, and 100 times, inclusive, a peak wavelength of the radiation generated in the active region in the medium adjacent to the interface with the surface structure on the part of the active region. In the case of a peak wavelength in the visible spectral range, a maximum value for the lateral extent of 20 µm inclusive has proved to be particularly advantageous. In the case of a photonic grating, a period length, that is to say the length after which the sequence of the structure elements is repeated, is preferably in the region of the peak wavelength, that is to say for instance between 0.5 times and 5 times the peak wavelength in the medium adjacent to the interface with the surface structure on the part of the active region.

In a preferred development, the growth substrate for the semiconductor layer sequence is removed or thinned. This can be effected in each case completely or at least in regions.

Absorption of radiation generated in the active region upon emerging from the semiconductor chip through a side of the semiconductor body that originally faces the growth substrate can advantageously be avoided or at least reduced by removing or thinning the growth substrate. In the case of a thinned growth substrate, the remaining residual thickness is preferably sufficiently thin such that radiation generated in the semiconductor body is absorbed only insignificantly during passage through the growth substrate.

Removal or thinning of the growth substrate is also advantageous in the case of a substrate transmissive to the radiation generated in the active region. The thinner the remaining growth substrate, the greater the extent to which the height of the semiconductor chip can be reduced. The radiation power emerging from the radiation exit area of the semiconductor chip, and hence the surface luminance of the semiconductor chip, can advantageously be increased as a result. Complete removal of the growth substrate is therefore advantageous, but thinning of the growth substrate can already be sufficient.

Furthermore, regions in which the growth substrate has been removed can serve for making electrical contact with the semiconductor body, in particular for impressing a current into the semiconductor body during the operation of the semiconductor chip.

The carrier is different from the growth substrate for the semiconductor layer sequence of the semiconductor body, that is to say the deposition of the semiconductor layer sequence of the semiconductor body is not effected on the carrier. Consequently, the carrier does not have to satisfy the stringent requirements, in particular with regard to the crystal quality, that are made of a growth substrate. Rather, the carrier can be chosen with regard to other properties, for instance mechanical stability or thermal conductivity. By way of example, the carrier can contain a semiconductor material such as GaAs, Ge, GaAsP, or Si, or consist of such a semiconductor material. Alternatively or supplementarily, the carrier can contain a metal, a plastic or a ceramic or consist of such a material.

In a preferred configuration, the radiation exit area of the semiconductor chip is embodied in structured fashion. Wave guiding in the semiconductor chip, in particular in a layer whose surface forms the radiation exit area, can advantageously be avoided in this way.

In a further preferred configuration, on that side of the semiconductor body which is remote from the carrier, a further contact layer transmissive to radiation generated in the active region during operation of the semiconductor chip, preferably a contact layer containing TCO material or consisting of such material, is arranged on the semiconductor body. This further contact layer has the advantage of areally impressing a current into the semiconductor body from that side of the active region which is remote from the carrier. The radiation exit area can be formed by that area of the further contact layer which is remote from the semiconductor body.

The semiconductor material for the semiconductor layer sequence can be deposited, for example epitaxially, for instance by means of LPE, MBE or MOVPE, on a growth substrate.

Preferably, the semiconductor body, in particular the active region, contains a III-V semiconductor material. With III-V semiconductor materials, advantageously high internal quantum efficiencies can be achieved during the generation of radiation.

In a further preferred configuration, the semiconductor chip is embodied as a thin-film semiconductor chip. A thin-film semiconductor chip, in particular a thin-film light emitting diode chip, can be distinguished by at least one of the following characteristic features:

the radiation generated in the active region of the semiconductor layer sequence of the semiconductor body is reflected back by the mirror layer, arranged between the semiconductor body and the carrier, at least partly into the semiconductor layer sequence;

the semiconductor layer sequence has a thickness in the region of 20 µm or less, in particular in the region of 10 µm; and/or the semiconductor layer sequence contains at least one semiconductor layer having at least one area which has an intermixing structure which ideally leads to an approximately ergodic distribution of the light in the epitaxial layer sequence, that is to say that it has an as far as possible ergodically stochastic scattering behavior.

A basic principle of a thin-film light emitting diode chip is described for example in I. Schnitzer et al., Appl. Phys. Lett. 63 (16), Oct. 18, 1993, 2174-2176, the disclosure content of which in this respect is hereby incorporated by reference.

A method according to the invention for producing a semiconductor chip comprising a semiconductor layer sequence comprising an active region provided for generating radiation has the following steps:

a) providing the semiconductor body comprising the semiconductor layer sequence, wherein a fixing area provided for fixing the semiconductor body is offered on the semiconductor body;

b) providing the carrier, wherein a mounting area provided for fixing the semiconductor body is offered on the carrier;

c) forming a connection layer between the fixing area and the mounting area for fixing the semiconductor body to the carrier and;

d) completing the semiconductor chip, wherein a plurality of reflective or scattering elements are formed between the second carrier area and the active region.

A cost-effective fixing of the semiconductor body to the carrier can be produced by means of the connection layer.

In a further preferred configuration, the connection layer is produced by means of a connection means in which particles are formed. Wave guiding within the connection layer can advantageously be disturbed by beam deflection by means of the particles.

In a further preferred configuration, prior to step c), the fixing area is embodied as an interface having a surface structure.

In a further preferred configuration, prior to step c), the mounting area is embodied as an interface having a surface structure.

It goes without saying that it is also possible for both the fixing area and the mounting area to be embodied in each case as an interface having a surface structure.

This surface structure of the interface is preferably formed by means of a structured surface.

The surface can be structured mechanically and/or chemically, for example by means of mechanical roughening, wet-chemical etching, dry-chemical etching, for instance by means of chemically assisted ion beam etching (CAIBE) or reactive ion etching (RIE).

By way of example, lithography, in particular photolithography or nano-imprint lithography, can be used for producing the structure for the structured surface. In the case of lithography, a sacrificial layer is generally arranged on the area to be structured. The sacrificial layer serves for masking the surface to be structured and can be removed, in particularly completely, after the lithography. By way of example, the sacrificial layer can be applied on the surface to be structured and can subsequently be structured. The lateral structure of the sacrificial layer can then be transferred to the surface, in particular by means of one of the etching methods mentioned above.

In the case of photolithography, the sacrificial layer is usually a photosensitive resist layer whose chemical properties are locally modified by means of irradiation through a correspondingly structured mask, for instance a metal mask, which enables formation of the structure in the sacrificial layer. With this method it is possible to achieve a structuring of areas with structure sizes of a few micrometers in a lateral direction. Both regular and irregular structures can be produced in this way.

In the case of nano-imprint lithography, the structuring of the sacrificial layer is effected by means of a shaping tool that is suitably structured. Said shaping tool, for instance a correspondingly structured stamp, is pressed into the sacrificial layer. The sacrificial layer can contain for example a thermoplastic polymer (thermoplastic nano-imprint lithography, T-NIL) or a photosensitive material (photo nano-imprint lithography, P-NIL). Surfaces can be structured in a particularly simple manner by means of nano-imprint lithography. In particular, it is possible to produce particularly small lateral structure sizes, that is to say structures smaller than 1 µm down to the range of smaller than 10 nm. Nano-imprint lithography is therefore particularly suitable for the production of structure sizes which are of the order of magnitude of the wavelength of radiation in the infrared, visible or ultraviolet spectral range, for instance for the production of structures for a photonic grating.

In a preferred configuration, the interface with the surface structure is formed by means of a mirror layer, wherein the mirror layer is deposited on the previously structured surface and the surface structure of the interface follows the structure of said prestructured surface. In this case, the mirror layer is preferably deposited by means of sputtering or vapor deposition on the structured surface. A mirroring area is therefore produced by means of depositing a mirroring layer on a prestructured area. Complex, costly structuring of a mirroring area, for example of a metal area, can advantageously be dispensed with.

In a preferred development, the growth substrate for the semiconductor layer sequence is removed or thinned. This can be effected completely or in regions. By way of example, a method such as grinding, etching or a laser separating method can be used for this purpose. In step a), the semiconductor body comprising the semiconductor layer sequence can be provided on the growth substrate. In this case, the growth substrate is preferably removed or thinned after step c).

In a departure from this, the growth substrate can also be removed or thinned prior to step c). In this case, the semiconductor body comprising the semiconductor layer sequence is preferably firstly fixed on an auxiliary carrier. Said auxiliary carrier can serve for the mechanical stabilization of the semiconductor body and be removed again after step c). In this way, it is also possible to produce a semiconductor chip in which an area of the semiconductor body that originally faced the growth substrate faces the carrier.

The method described is particularly suitable for producing a semiconductor chip according to the invention.

BRIEF DESCRIPTION OF THE FIGURES

Further features, advantageous configurations and expediences of the invention will become apparent from the following description of the exemplary embodiments in conjunction with the figures.

In the figures.

These figures are in each case schematic illustrations and therefore not necessarily true to scale. Rather, comparatively small elements and in particular layer thicknesses may be illustrated with an exaggerated size for the sake of clarification.

Elements which are identical, of an identical type and act identically are provided with identical reference symbols in the figures.

DETAILED DESCRIPTION

Figure 1:
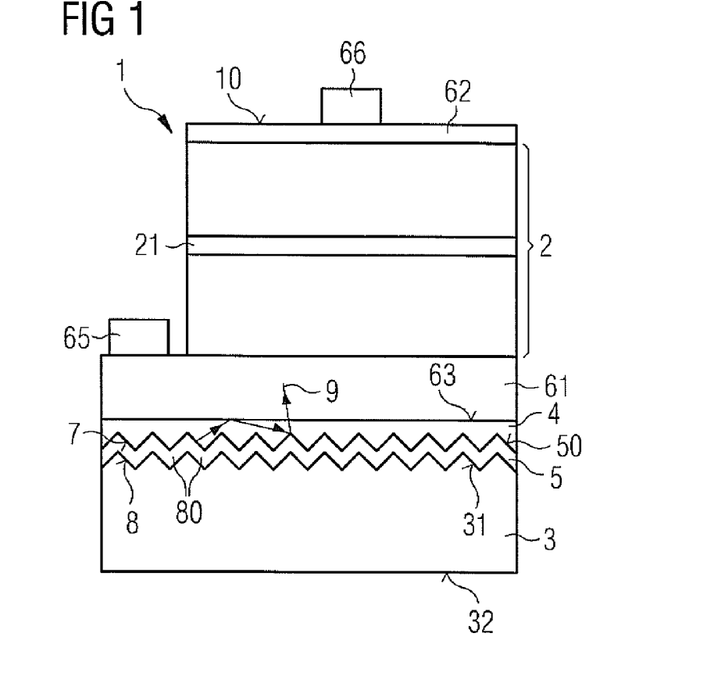
FIG. 1 shows a schematic sectional view of a first exemplary embodiment of a semiconductor chip according to the invention.

In the first exemplary embodiment of a semiconductor chip according to the invention as illustrated schematically in FIG. 1, the semiconductor chip 1 comprises a semiconductor body 2 comprising a semiconductor layer sequence having an active region 21 provided for generating radiation. The semiconductor chip 2 is preferably embodied as an LED chip and provided for generating incoherent radiation. The semiconductor body 2 is cohesively fixed to a carrier 3 by means of a connection layer 4. The carrier 3 has a first carrier area 31 facing the semiconductor body and a second carrier area 32 remote from the semiconductor body.

Preferably, the connection layer 4 is formed by means of a molding compound. By way of example, the connection layer can be an adhesive layer. The molding compound can be applied to the carrier, for example, before the semiconductor body 2 and the carrier 3 are joined together. By means of the cohesive connection, the semiconductor body 2 can be fixed to the carrier 3 in a simplified manner.

A contact layer 61 having a contact area 63 remote from the semiconductor body 2 is formed between the semiconductor body 2 and the carrier 3, said contact layer 61 being transmissive to radiation generated in the active region. Preferably, the contact layer 61 contains a TCO material, for example a binary metal oxide, such as zinc oxide, tin oxide, cadmium oxide, titanium oxide, indium oxide or indium tin oxide (ITO). Ternary or quaternary metal oxides can also be employed.

The contact layer 61 is electrically conductively connected to a contact 65. A further contact layer 62 is arranged on that side of the active region 21 which is remote from the carrier 3. Said further contact layer 62 is electrically conductively connected to a further contact 66 and can likewise contain a TCO material. The contact layers 61 and 62 can be deposited onto the semiconductor body 2 by means of sputtering or vapor deposition, for example.

By means of the contact layers 61 and 62, during the operation of the semiconductor body 2, it is possible to achieve an areal impressing of an operating current into the semiconductor body 2, and in particular into the active region 21, wherein the contact layers 61 and 62 can be embodied simultaneously as transmissive to the radiation generated in the active region 21. These contact layers 61 and 62 arranged outside the semiconductor body 2 are advantageous in particular on account of their high transverse conductivity. However, they are not absolutely necessary. By way of example, it is possible to provide alternatively, in particular highly doped, semiconductor layers in the semiconductor body for making electrical contact.

The contacts 65 and 66 are provided for feeding charge carriers into the semiconductor body 2 during the operation of the semiconductor chip 1. Said charge carriers can pass into the active region and recombine there with emission of electromagnetic radiation. The high transverse conductivity of the contact layer 61 has the advantage that the charge carriers fed in via the contact 65 can be supplied comparatively uniformly to the semiconductor body 2 in a lateral direction.

Both contacts are arranged on that side of the connection layer 4 which is remote from the carrier 3. Contact-making on the part of the second carrier area 32 is not effected. Therefore, elements arranged between the contact layer 61 and the second carrier area 32, in particular the connection layer 4 and the carrier 3, do not have to be embodied in electrically conductive fashion.

The contacts 65 and 66 expediently contain a metal or a metallic alloy. By way of example, the contacts can contain Au, Ag, Ni, Pt, Cu, Ti, Al or an alloy with at least one of the materials or can consist of such a material. The contacts 65 and 66 can be produced by means of sputtering or vapor deposition, for example.

The first carrier area of the carrier 31, which faces the semiconductor body 2, is embodied as a structured surface 8. The structured surface 8 has periodically arranged structure elements 80 embodied in pyramid-like fashion. The structure elements 80 therefore have side areas which are inclined obliquely with respect to one another and which run in particular transversely with respect to a main extension direction of the semiconductor layers of the semiconductor layer sequence of the semiconductor body 2. As an alternative, the structure elements 80 can be embodied for example in groove-like fashion, for instance with a triangle-like cross section.

In a departure from the example shown, the structured surface 8 can also have irregularly arranged structure elements. Furthermore, the structured surface 8 can also be structured only in regions.

The structure elements 80 preferably have a lateral extent lying between 0.1 times, inclusive, and 200 times, inclusive, particularly preferably between 0.5 times, inclusive, and 100 times, inclusive, a peak wavelength of the radiation generated in the active region 21 in the medium adjacent to the interface 7 with the surface structure on the part of the active region 21. In the case of a peak wavelength in the visible spectral range, a maximum value for the lateral extent of up to 20 μm inclusive has proved to be particularly advantageous.

The structure elements 80 can be produced mechanically and/or chemically, for example by means of mechanical roughening, wet-chemical etching, or dry-chemical etching, for instance by means of chemically assisted ion beam etching (CAIBE) or reactive ion etching (RIE).

A mirror layer 5 is arranged on the first carrier area 31 of the carrier 3, which faces the semiconductor body 2. Said mirror layer 5 serves for reflecting radiation that is generated in the active region 21 and emitted in the direction of the carrier 3. The mirror layer 5 preferably contains a metal and is particularly preferably embodied in metallic fashion. By way of example, the mirror layer 5 can contain Al, Ag, Au, Ni, Cu or Pt. Au, for example, is distinguished by a high reflectivity in the yellow, red and infrared spectral range. Al has a high reflectivity in the ultraviolet and in the visible spectral range. The mirror layer 5 is preferably deposited, for example by means of sputtering or vapor deposition, on the prestructured first carrier area 31 of the carrier 3.

An area 50 of the mirror layer 5 that faces the active region 21 forms an interface 7 with a surface structure. In this case, the surface structure of the interface follows the structure of the first carrier area 31, which forms the structured surface 8. The layer thickness of the mirror layer 5 is expediently thin enough that the structure of the structured surface 8, that is to say of the carrier area 31, is not or not significantly leveled. Preferably, the surface structure of the interface 7 imitates the structure of the structured carrier area 31 as precisely as possible.

The partial regions of the interface 7 that are formed by means of the surface structure of the interface 7 represent in each case reflective elements for radiation generated in the active region 21.

The connection layer 4 is expediently embodied such that it is transmissive to radiation generated in the active region 21. Thus, radiation generated in the active region 21 and emitted in the direction of the carrier 3, after reflection at the mirror layer 5, can emerge from the semiconductor chip 1 through the radiation exit area 10.

Furthermore, the connection layer 4 and/or the contact layer 61 can be matched to the refractive index of the semiconductor body 2 with regard to their/its refractive indices/index. By means of a refractive index of the connection layer 4 and/or of the contact layer 61 that is matched to the comparatively high refractive index of the semiconductor body 2, it is possible to increase the proportion of radiation which is emitted in the direction of the carrier 3 and which impinges on the interface with the surface structure 7.

The connection layer 4 is integrally formed onto the interface with the surface structure 7. Consequently, that area of the connection layer 4 which faces the interface with the surface structure 7 likewise has this surface structure.

The effect of the surface structure of the interface 7 on radiation that runs in the connection layer 4 is illustrated on the basis of an arrow 9. The radiation firstly impinges, at an angle lying above the critical angle of total reflection, on the surface 63 of the contact layer 61 that faces the carrier 3, and it is reflected at this surface. The radiation subsequently impinges on the interface 7 with the surface structure. From this, the radiation is reflected back into the connection layer 4 in such a way that the radiation subsequently impinges on the surface 63 of the contact layer 61 at an angle that lies below the critical angle of total reflection. The radiation represented by the arrow 9 can consequently emerge from the connection layer 4. Wave guiding of radiation in the connection layer 4 can therefore be disturbed. The radiation power emerging from a radiation exit area 10 of the semiconductor chip 1 that is formed on that side of the active region 21 which is remote from the carrier 3 can advantageously be increased as a result.

Furthermore, the connection layer 4 can be embodied in electrically insulating fashion. The semiconductor chip 2 can therefore be fixed to the carrier 3 in a manner electrically insulated therefrom.

Preferably, the semiconductor body 2, in particular the active region 21, contains a III-V semiconductor material. III-V semiconductor materials are particularly suitable for generating radiation in the ultraviolet ($In_xGa_yAl_{1-x-y}N$) through the visible ($In_xGa_yAl_{1-x-y}N$) in particular for blue to green radiation, or $In_xGa_yAl_{1-x-y}P$, in particular for yellow to red radiation) to the infrared ($In_xGa_yAl_{1-x-y}As$) spectral range. The following hold true in each case here: $0 \leq x \leq 1$, $0 \leq y \leq 1$ and $x+y \leq 1$, preferably where $x \neq 0$, $y \neq 0$, $x \neq 1$ and $y \neq 1$. Furthermore, III-V semiconductor materials, in particular those mentioned, are distinguished by high quantum efficiencies that are achievable.

The semiconductor chip 1 is embodied as a thin-film semiconductor chip. The growth substrate for the semiconductor layer sequence of the semiconductor body 2 is completely removed and therefore not illustrated in FIG. 1. The removal of the growth substrate makes it possible to prevent radiation emerging laterally from the growth substrate. The radiation power emerging from the radiation exit area 10 can advantageously be increased in this way. It is furthermore possible to prevent radiation from being absorbed in the growth substrate.

The carrier 3 is not identical to the growth substrate and does not have to satisfy the stringent requirements, in particular with regard to the crystalline purity, that are made of a growth substrate. Instead, the carrier 3 can be chosen according to other criteria, for example thermal conductivity or mechanical stability or structurability. Preferably, the carrier 3 contains a semiconductor material, for example Si, GaAs, Ge or SiC, or consists of such a material. A semiconductor material, in particular Si, is particularly suitable since this is typically distinguished by very good structurability, for example by means of etching. Moreover, Si is a comparatively cost-effective semiconductor material.

Alternatively or supplementarily, the carrier can contain a metal, for instance Cu, a ceramic, or a plastic, or can consist of such a material.

Figure 2:
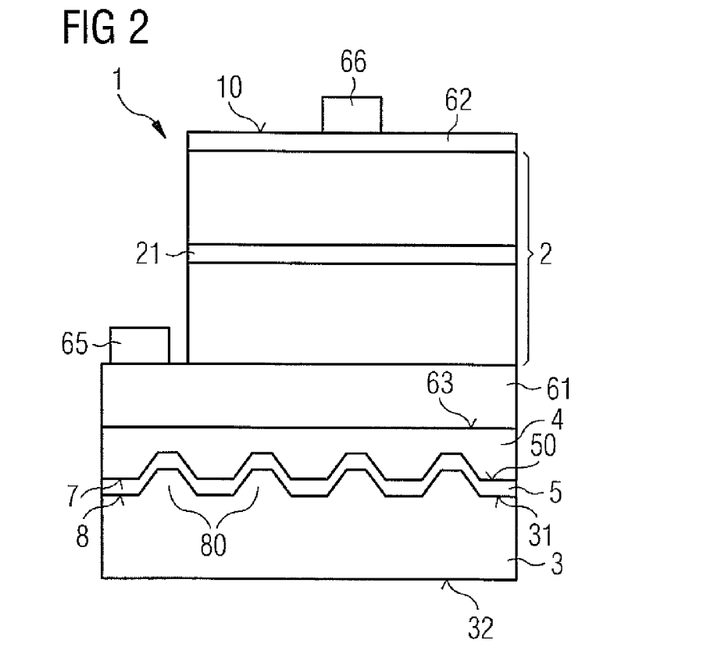
FIG. 2 shows a schematic sectional view of a second exemplary embodiment of a semiconductor chip according to the invention.

FIG. 2 shows a second exemplary embodiment of a semiconductor chip 1 according to the invention. This second exemplary embodiment corresponds substantially to the first exemplary embodiment. In a departure therefrom, the structured surface 8, which is the first carrier area 31 of the carrier 3 as in the first exemplary embodiment, has structure elements 80 in the form of elevations running in truncated-pyramid-like fashion. Such elevations can be produced for example by means of wet-chemical etching of the carrier material originally situated between the elevations.

Figure 3:
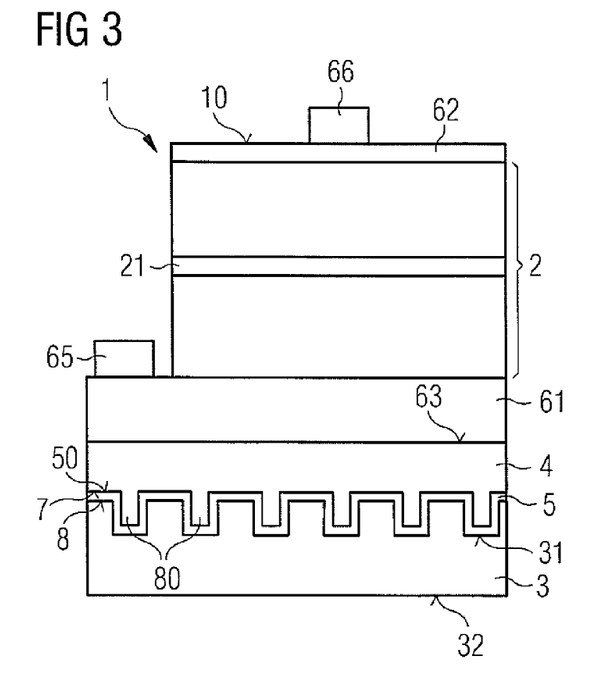
FIG. 3 shows a schematic sectional view of a third exemplary embodiment of a semiconductor chip according to the invention.

FIG. 3 shows a third exemplary embodiment of a semiconductor chip 1 according to the invention. This third exemplary embodiment corresponds substantially to the first exemplary embodiment. In a departure therefrom, the structured surface 8 is shaped for a photonic grating. Trench-like depressions are formed in the surface, said depressions being arranged periodically. The grating is preferably embodied as a two-dimensional grating, that is to say that it can have a periodic structure along two directions, particularly preferably running perpendicularly with respect to one another. The period length preferably lies in the region of the peak wavelength of the radiation generated in the active region 21 in the medium, that is to say the connection layer 4, adjacent to the interface 7 with the surface structure. The interface 7 with the surface structure, which is formed by that surface 50 of the mirror layer 5 which faces the active region as in the first exemplary embodiment, in this case constitutes a reflective diffraction grating.

As an alternative to the exemplary embodiments described in connection with FIGS. 1 to 3, the interface 7 with the surface structure can be the structured surface, that is to say for instance the first carrier area 31. The mirror layer 5 can be dispensed with in this case. This can be expedient in particular if the carrier 3 is embodied as sufficiently reflective. By way of example, the carrier 3 can be embodied as a self-supporting metal carrier.

Structuring of the carrier 3 or of a layer applied thereon has the advantage that the structure produced can be tested, for instance with regard to its optical properties, before the semiconductor body 2 is fixed to the carrier 3. Furthermore, the semiconductor body 2 advantageously need not be structured. The risk of damage to the semiconductor body 2, which is produced cost-intensively in comparison with the carrier 3, during structuring can thus be avoided.

Figure 4:
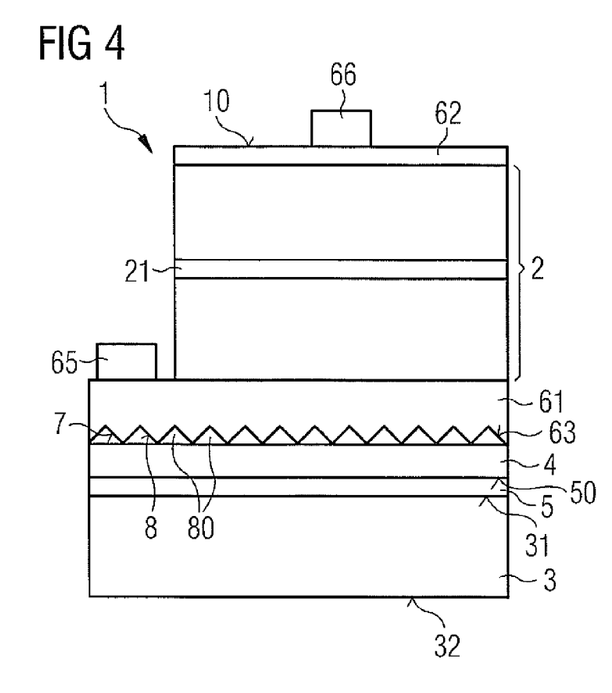
FIG. 4 shows a schematic sectional view of a fourth exemplary embodiment of a semiconductor chip according to the invention.

FIG. 4 shows a fourth exemplary embodiment of a semiconductor chip 1 according to the invention. This fourth exemplary embodiment corresponds substantially to the first exemplary embodiment. In a departure therefrom, the interface 7 with the surface structure is the area 63 of the contact layer 61 that faces the carrier 3. Consequently, the interface with the surface structure is formed between the semiconductor body 2 and the connection layer 4. In this case, the structure can be embodied in the manner described in connection with FIGS. 1 to 3.

The connection layer 4 is once again adjacent to the interface 7 with the surface structure and is integrally formed onto the latter. Wave guiding of radiation running in the connection layer 4 can advantageously be disturbed by said interface. Furthermore, wave guiding of radiation running within the contact layer 61 can also be disturbed. The coupling-out efficiency of radiation generated in the active region 21 from the semiconductor chip 1 can advantageously be increased in this way.

Structuring of an area arranged between the connection layer 4 and the second carrier area 32, for instance of the first carrier area 31, for disturbing the wave guiding in the connection layer 4 can be dispensed with in this fourth exemplary embodiment. However, such structuring can additionally be formed.

Figure 5:
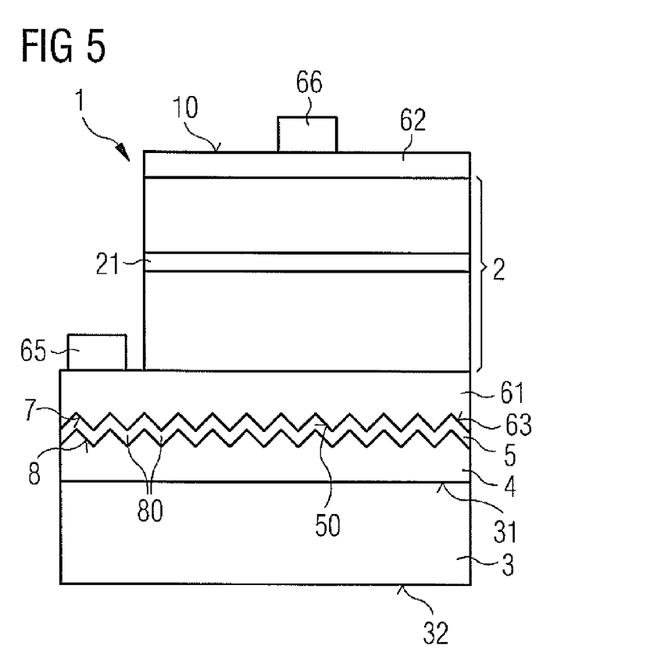
FIG. 5 shows a schematic sectional view of a fifth exemplary embodiment of a semiconductor chip according to the invention.

FIG. 5 shows a fifth exemplary embodiment of a semiconductor chip 1 according to the invention. This fifth exemplary embodiment corresponds substantially to the fourth exemplary embodiment. In contrast thereto, the mirror layer 5 is arranged between the active region 21 and the connection layer 4. In this case, the interface 7 with the surface structure is the surface 50 of the mirror layer 5 that faces the active region 21, wherein the mirror layer 5 is adjacent to the surface 63 of the contact layer 61 that faces the carrier 3, and is integrally formed onto this. In this exemplary embodiment, the surface 63 of the contact layer 61 that faces the carrier 3 is the structured surface 8.

The surface structure of the interface 7, that is to say the surface 50 of the mirror layer 5 that faces the active region 21, follows the structure of the structured surface 8. Radiation generated in the active region 21 and emitted in the direction of the carrier 3 is reflected by the mirror layer 5. Expediently, the mirror layer 5 is not, or only slightly, transmissive to said radiation, with the result that the radiation does not enter into the connection layer 4.

The connection layer 4 can therefore be chosen independently of its optical properties. By way of example, the connection layer 4 can be embodied such that it is absorbent to radiation generated in the active region 21. In particular, the connection layer 4 can also be embodied as a radiation-absorbent adhesive layer or as a solder layer.

Figure 6:
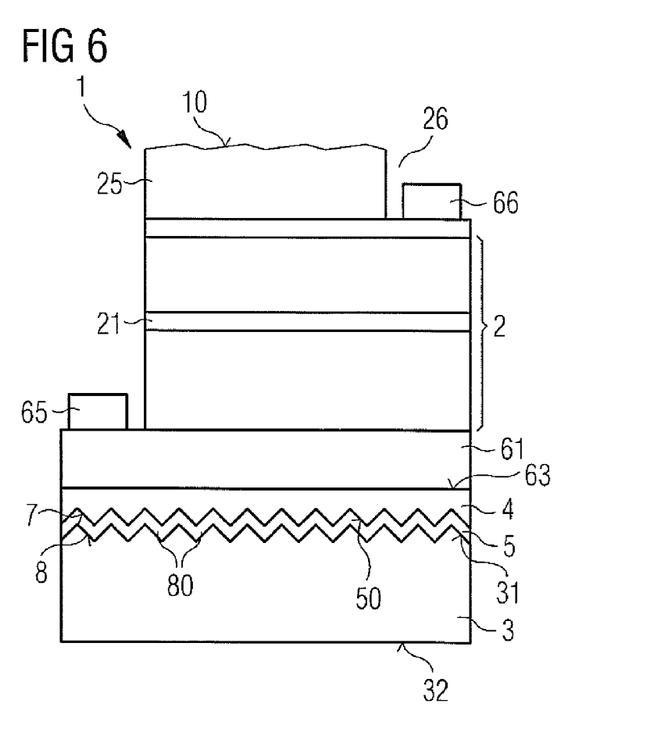
FIG. 6 shows a schematic sectional view of a sixth exemplary embodiment of a semiconductor chip according to the invention.

A sixth exemplary embodiment of a semiconductor chip 1 according to the invention is illustrated in FIG. 6. This sixth exemplary embodiment corresponds substantially to the first exemplary embodiment. In contrast thereto, the growth substrate 25 for the semiconductor layer sequence of the semiconductor body 2 is removed only in regions. In this case, the growth substrate 25 can be thinned. Moreover, the further contact layer 62 is dispensed with.

The growth substrate 25 has a cutout 26. The semiconductor body 2 is uncovered in the region of the cutout. The further contact 66 is arranged in said cutout. The further contact 66 is directly adjacent to the semiconductor body 2. That area of the growth substrate 25 which is remote from the active region 21 forms the radiation exit area 10 of the semiconductor chip 1.

In a departure from this exemplary embodiment, the cutout 26 can be dispensed with. This can be expedient in particular if the growth substrate 25 has a sufficiently high conductivity, for instance on account of a suitable doping. In this case, the further contact 66 can be formed on that area of the growth substrate 25 which is remote from the active region 21. In this variant, too, the growth substrate 25 can be thinned completely or in regions. The thinner the growth substrate 25, the lower the radiation power emerging from the side areas that bound the growth substrate 25 in a lateral direction. The radiation power emerging from the radiation exit area 10 of the semiconductor chip 1 can advantageously be increased in this way.

The radiation exit area 10 of the semiconductor chip 1 is embodied in structured fashion. By means of the structuring, it is possible to disturb the wave guiding in the element forming the radiation exit area 10, for example in the growth substrate 25. In the example shown, the structuring of the radiation exit area 10 is irregular. In a departure therefrom, the radiation exit area 10 can be structured in the same way as was described in connection with FIGS. 1 to 3 for the structuring of the structured surface 8.

It goes without saying that structuring of the radiation exit area 10 is also possible in the further exemplary embodiments described in connection with FIGS. 1 to 5 and 7.

Figure 7:
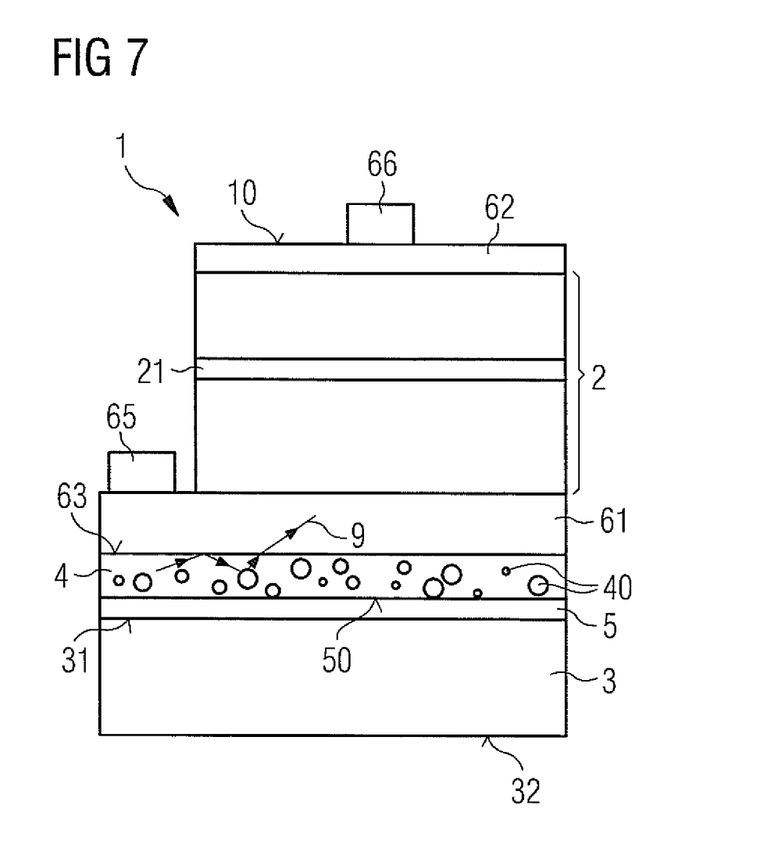
FIG. 7 shows a schematic sectional view of a seventh exemplary embodiment of a semiconductor chip according to the invention.

A seventh exemplary embodiment of a semiconductor chip 1 according to the invention is illustrated in FIG. 7. This seventh exemplary embodiment corresponds substantially to the first exemplary embodiment. In contrast to the first exemplary embodiment, the reflective or scattering elements are formed by means of particles 40 formed in the connection layer 4. By way of example, the connection layer 4 can be formed by means of a molding compound into which the particles are embedded. The particles 40 can be for example metal particles, for instance Ag particles. Furthermore, the particles can have different sizes at least in part. Radiation generated in the active region 21 and running in the connection layer 4 can be scattered or reflected at said particles. As illustrated by the arrow 9, reflection or scattering at the particles can bring about a change in the direction in which the radiation propagates in the connection layer 4. Wave guiding in the connection layer 4 can thereby be disturbed.

The particles 40 can also be embodied such that they are transmissive to the radiation in the active region 21. In this case, too, the particles can bring about a change in the direction in which radiation propagates in the connection layer 4, for instance also during passage through the particles on account of refraction or as a result of the scattering at the particles.

An interface 7 with a surface structure such as was described in connection with FIGS. 1 to 3 is not necessary in this exemplary embodiment for the disturbance of the wave guiding, but can, of course, additionally be used. In particular, structuring of the semiconductor body 2 can be dispensed with during the production of the semiconductor chip 1.

Figure 8A:
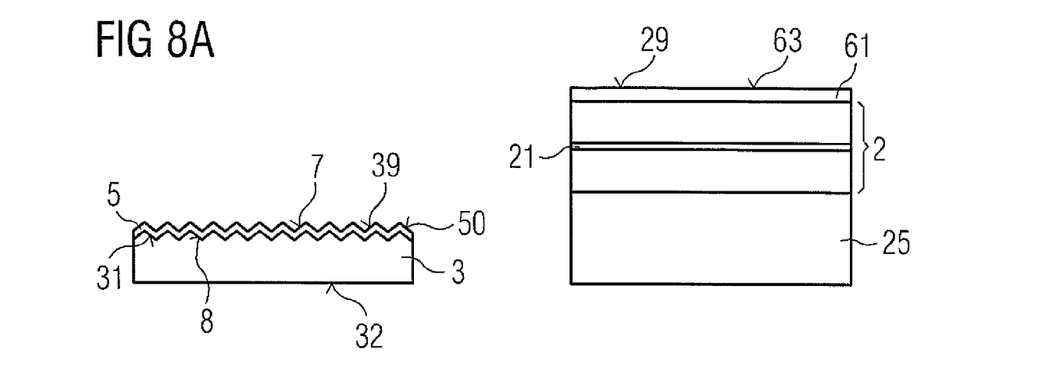
FIGS. 8A to 8C show an exemplary embodiment of a production method according to the invention on the basis of intermediate steps shown in schematic sectional view.
Figure 8B:
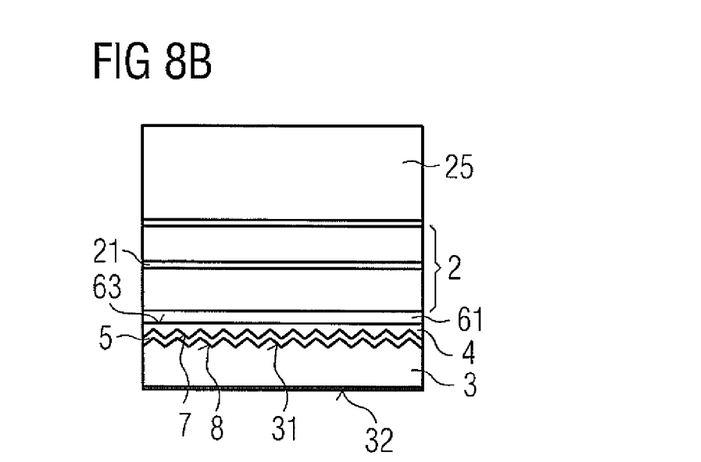
Figure 8C:
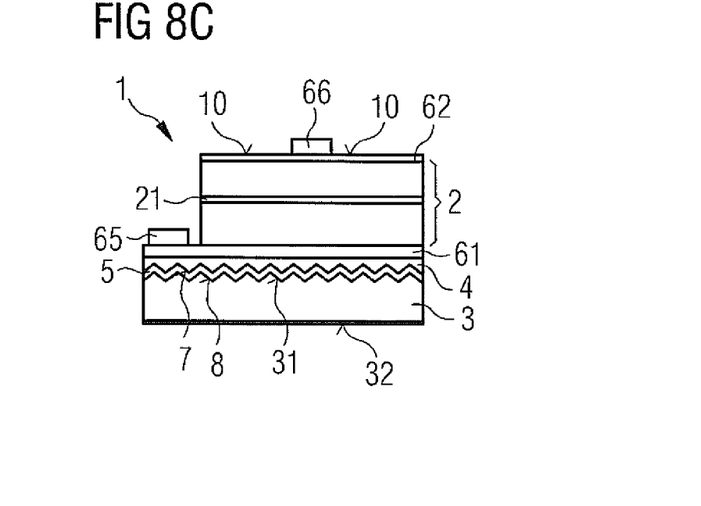

An exemplary embodiment of a method according to the invention for producing a semiconductor chip 1 is illustrated schematically on the basis of intermediate steps in FIGS. 8A to 8C. The production of a semiconductor chip embodied in the manner described in connection with FIG. 1 is illustrated by way of example in this exemplary embodiment. It goes without saying that the method is also suitable for the production of semiconductor chips 1 constructed in a manner deviating from that, in particular for semiconductor chips as explained in connection with FIGS. 1 to 7.

FIG. 8A shows a carrier 3 having a first carrier area 31 and a second carrier area 32. Said first carrier area 31 is embodied as a structured surface 8. A mirror layer 5 is arranged on said first carrier area 31. The surface 50 of the mirror layer 5 that is remote from the carrier 3 represents a mounting area 39 offered for mounting the semiconductor body 2 at the carrier 3. The mounting area 39 is embodied as an interface 7 having a surface structure. The surface structure of the interface 7 follows the structure of the structured surface 8, that is to say the first carrier area 31 of the carrier 3.

Preferably, the structure of the structured surface 8 is produced mechanically and/or chemically for example by means of mechanical roughening or back-sputtering or by means of etching. By way of example, wet-chemical etching or dry-chemical etching, for instance chemically assisted ion beam etching (CAIBE), reactive ion etching (RIE) or ion beam etching are suitable.

Furthermore, lithographic methods, in particular photolithography or nano-imprint lithography, can be used for the production of the structure, wherein preferably firstly a sacrificial layer is applied to the surface to be structured and is correspondingly structured. Afterward, the basic pattern of the lateral structure of the sacrificial layer is transferred to the surface to be structured by means of one of the etching methods mentioned.

In particular, a surface structure for a photonic grating as described in connection with FIG. 3 is preferably produced by means of nano-imprint lithography. The shaping tool can for example contain quartz glass or consist of quartz glass.

The sacrificial layer can contain a thermoplastic that is cured by heating after the shaping tool has been pressed into the sacrificial layer. As an alternative, the sacrificial layer can contain a photosensitive material, in the case of which curing is effected for example by irradiation by means of high-energy radiation, for instance ultraviolet radiation, after the shaping tool has been pressed in.

Particularly small lateral structure sizes, that is to say structures of smaller than 1 µm down to the range of smaller than 10 nm, can also be produced by nano-imprint lithography. Therefore, nano-imprint lithography is particularly suitable for the production of structure sizes of the order of magnitude of the peak wavelength of radiation which is generated in the active region 21 and which preferably lies in the infrared, visible or ultraviolet spectral range, for instance for the production of structures for a photonic grating. Dry-chemical etching methods, for instance CAIBE or RIE, are particularly advantageous for transferring such small structures of the upper layer into the surface to be structured.

A prestructured mounting area 39 is offered for mounting the semiconductor body 2. The structure of the mounting area 39 can advantageously already be tested, for example with regard to its optical properties, before the fixing of the semiconductor body 2. Furthermore, structuring of the semiconductor body 2 can advantageously be dispensed with. The risk of damage to the semiconductor body 2 during structuring can advantageously be avoided.

Furthermore, a semiconductor body 2 comprising a semiconductor layer sequence is provided, which is deposited on a growth substrate 25. The semiconductor layer sequence is preferably deposited epitaxially, for example by means of MBE, MOVPE or LPE. The growth substrate 25 can for example contain GaAs, SiC, GaAsP or sapphire or consist of such a material.

A contact layer 61 is applied, preferably deposited, for example by means of sputtering or vapor deposition, onto the prefabricated semiconductor body 2. A surface 63 of the contact layer 61 that is remote from the semiconductor body 2, and faces the carrier 3 after fixing, forms a fixing area 29 provided for fixing the semiconductor body 2 to the carrier 3.

A connection layer 4 is subsequently formed between the fixing area 29 and the mounting area 39. This is illustrated in FIG. 8B. The connection layer is preferably formed by means of a molding compound, for instance an adhesive compound. The molding compound can be provided on the mounting area 39 or on the fixing area 29.

A completed semiconductor chip is shown in FIG. 8C. In the course of completion, firstly the growth substrate 25 is removed. This can be effected for example by means of grinding, etching or by means of a laser separating method.

The contact layer 61 is subsequently uncovered. For this purpose, the semiconductor body 2 is removed in regions, preferably by means of etching. For making contact with the semiconductor body 2 on the part of that side of the active region 21 which is remote from the carrier 3, a further contact layer 62 can optionally be applied, preferably deposited, for example by means of sputtering or vapor deposition, on the semiconductor body 2. A contact 65 and a further contact 66 are provided on the contact layer 61 and the further contact layer 62, respectively, wherein the contact 65 is deposited on the contact layer 61 in the uncovered region thereof. The semiconductor body 2 can be electrically connected via the contacts 65 and 66.

In an alternative variant, the semiconductor body can also be provided on an auxiliary carrier. The latter can serve for mechanically stabilizing the semiconductor layer sequence. In this case, the growth substrate 25 is not necessary for this purpose. Thus, the growth substrate 25 can already be stripped away or thinned, at least in regions, before the semiconductor body 2 is fixed to the carrier 3.

Furthermore, in this alternative variant, the area of the semiconductor body 2 that originally faced the growth substrate 25 can face the carrier 3. In this case, too, the growth substrate 25 is preferably thinned or removed at least in regions.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or the exemplary embodiments.

The invention claimed is:

1. A semiconductor chip comprising:
    a semiconductor body, which comprises a semiconductor layer sequence comprising an active region provided for generating radiation,
    a carrier that has a first carrier area facing the semiconductor body and a second carrier area remote from the semiconductor body, the semiconductor body fixed to the carrier by a connection layer, and
    a plurality of reflective or scattering elements disposed between the second carrier area and the active region;
    wherein the semiconductor chip further comprises at least one of the following:
    (i) a contact layer transmissive to radiation generated in the active region, the contact layer disposed between the semiconductor body and the connection layer, wherein a refractive index of the contact layer is matched to a refractive index of the semiconductor body; and
    (ii) a refractive index of the connection layer is matched to a refractive index of the semiconductor body.

2. The semiconductor chip as claimed in claim 1, wherein the plurality of reflective or scattering elements are disposed between the second carrier area and the semiconductor body.

3. The semiconductor chip as claimed in claim 1, wherein the contact layer contains a transparent conductive oxide (TCO) material.

4. The semiconductor chip as claimed in claim 1, wherein the connection layer is embodied in such a way that wave guiding of the radiation generated in the active region during operation of the semiconductor chip is disturbed within the connection layer.

5. The semiconductor chip as claimed in claim 1, wherein the plurality of reflective or scattering elements comprise particles formed in the connection layer.

6. The semiconductor chip as claimed in claim 1, further comprising a mirror layer between the semiconductor body and the carrier.

7. The semiconductor chip as claimed in claim 1, wherein the plurality of reflective or scattering elements comprise an interface having a surface structure at least in regions.

8. The semiconductor chip as claimed in claim 7, wherein the connection layer is integrally formed onto the interface with the surface structure.

9. The semiconductor chip as claimed in claim 7, wherein the surface structure of the interface comprises a structured surface.

10. The semiconductor chip as claimed in claim 9, wherein the interface with the surface structure is the structured surface.

11. The semiconductor chip as claimed in claim 9, further comprising a mirror layer between the semiconductor body and the carrier, wherein the interface with the surface structure comprises an area of the minor layer that faces the active region and wherein the surface structure of the interface follows the structure of the structured surface.

12. The semiconductor chip as claimed in claim 9, wherein the structured surface comprises structure elements that are arranged irregularly.

13. The semiconductor chip as claimed in claim 9, wherein the structured surface comprises structure elements that are arranged periodically.

14. The semiconductor chip as claimed in claim 13, wherein the structured surface is embodied for a photonic grating.

15. The semiconductor chip as claimed in claim 13, wherein the structure elements are embodied in pyramid-like, truncated-pyramid-like, microprism-like or groove-like fashion.

16. The semiconductor chip as claimed in claim 13, wherein a lateral extent of the structure elements lies between 0.5 times, inclusive, and 100 times, inclusive, a peak wavelength of the radiation generated in the active region in a medium that is adjacent to the interface with the surface structure and facing the active region.

17. The semiconductor chip as claimed in claim 16, further comprising a contact layer transmissive to radiation generated in the active region, the contact layer disposed between the semiconductor body and the connection layer, wherein the structured surface comprises an area of the contact layer that faces the carrier.

18. The semiconductor chip as claimed in claim 9, wherein the structured surface is arranged between the active region and the connection layer.

19. The semiconductor chip as claimed in claim 9, wherein the structured surface is arranged between the connection layer and the second carrier area.

20. The semiconductor chip as claimed in claim 1, wherein the connection layer comprises an adhesive layer.

21. The semiconductor chip as claimed in claim 1, wherein the connection layer is transmissive to radiation generated in the active region.

22. The semiconductor chip as claimed in claim 1, wherein the connection layer is electrically insulating.

23. The semiconductor chip as claimed in claim 1, further comprising a radiation exit area of the semiconductor chip that is arranged on a side of the active region that is remote from the carrier, the radiation area being embodied in structured fashion.

24. The semiconductor chip as claimed in claim 1 further comprising, a further contact layer, the further contact layer being transmissive to radiation generated in the active region on the side of the semiconductor body that is remote from the carrier.

25. The semiconductor chip as claimed in claim 1, wherein the semiconductor chip is a thin-film semiconductor chip.

26. The semiconductor chip as claimed in claim 1, wherein a growth substrate for the semiconductor layer sequence of the semiconductor body is removed or thinned at least in regions.

27. A thin-film semiconductor chip comprising:
a semiconductor body, which comprises a semiconductor layer sequence comprising an active region provided for generating radiation,
a carrier that has a first carrier area facing the semiconductor body and a second carrier area remote from the semiconductor body, the semiconductor body fixed to the carrier by a connection layer, and
a plurality of reflective or scattering elements disposed between the second carrier area and the active region,
wherein, in top view, the connection layer covers the semiconductor body completely,
wherein the plurality of reflective or scattering elements comprise an interface having a surface structure at least in regions, the connection layer being adjacent to the interface with the surface structure and being integrally formed onto the interface with the surface structure, and
wherein the connection layer is between the interface with the surface structure and the active region of the semiconductor body.

28. The thin-film semiconductor chip as claimed in claim 27, wherein a growth substrate for the semiconductor layer sequence of the semiconductor body is removed.

29. The thin-film semiconductor chip as claimed in claim 27, wherein the connection layer is electrically insulating.

30. A semiconductor chip comprising:
a semiconductor body, which comprises a semiconductor layer sequence comprising an active region provided for generating radiation,
a carrier that has a first carrier area facing the semiconductor body and a second carrier area remote from the semiconductor body, the semiconductor body fixed to the carrier by a connection layer, and
a plurality of reflective or scattering elements disposed between the second carrier area and the active region,
wherein the plurality of reflective or scattering elements comprise an interface having a surface structure at least in regions, the surface structure of the interface comprising a structured surface, wherein the structured surface is arranged between the connection layer and the second carrier area.

31. The semiconductor chip as claimed in claim 30, wherein the structured surface is the first carrier area of the carrier.

32. A semiconductor chip comprising:
a semiconductor body, which comprises a semiconductor layer sequence comprising an active region provided for generating radiation,
a carrier that has a first carrier area facing the semiconductor body and a second carrier area remote from the semiconductor body, the semiconductor body fixed to the carrier by a connection layer,
a plurality of reflective or scattering elements disposed between the second carrier area and the active region,
wherein the plurality of reflective or scattering elements comprise an interface having a surface structure at least in regions, the surface structure of the interface comprising a structured surface, wherein the structured surface comprises structure elements that are arranged periodically, and wherein a lateral extent of the structure elements lies between 0.5 times, inclusive, and 100 times, inclusive, a peak wavelength of the radiation generated in the active region in a medium that is adjacent to the interface with the surface structure and facing the active region, and a contact layer transmissive to radiation generated in the active region, the contact layer disposed between the semiconductor body and the connection layer, wherein the structured surface comprises an area of the contact layer that faces the carrier.

33. A thin-film semiconductor chip comprising:

a semiconductor body, which comprises a semiconductor layer sequence comprising an active region provided for generating radiation, a carrier that has a first carrier area facing the semiconductor body and a second carrier area remote from the semiconductor body, the semiconductor body fixed to the carrier by an electrically insulating connection layer, and a plurality of reflective or scattering elements disposed between the second carrier area and the active region, wherein, in top view, the connection layer covers the semiconductor body completely.

34. The thin-film semiconductor chip as claimed in claim 33, wherein the plurality of reflective or scattering elements comprise an interface having a surface structure at least in regions, the connection layer being adjacent to the interface with the surface structure and being integrally formed onto the latter.

* * * * *

UNITED STATES PATENT AND TRADEMARK OFFICE
CERTIFICATE OF CORRECTION

| | |
|---|---|
| PATENT NO. | : 8,431,937 B2 |
| APPLICATION NO. | : 12/442501 |
| DATED | : April 30, 2013 |
| INVENTOR(S) | : Strauss |

It is certified that error appears in the above-identified patent and that said Letters Patent is hereby corrected as shown below:

In the Claims:

In Col. 17, line 22, claim 11, delete "minor" and insert --mirror--.

Signed and Sealed this
Second Day of July, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,431,937 B2  Page 1 of 1
APPLICATION NO. : 12/442501
DATED : April 30, 2013
INVENTOR(S) : Uwe Strauss It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 809 days.

Signed and Sealed this
Eighth Day of September, 2015

Michelle K. Lee
*Director of the United States Patent and Trademark Office*